(12) United States Patent
Han et al.

(10) Patent No.: US 10,249,383 B2
(45) Date of Patent: Apr. 2, 2019

(54) DATA STORAGE DEVICE AND OPERATING METHOD THEREOF

(71) Applicant: SK hynix Inc., Gyeonggi-do (KR)

(72) Inventors: Ju Hyeon Han, Gyeonggi-do (KR);
Jong Won Park, Gyeonggi-do (KR);
Chan Woo Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 72 days.

(21) Appl. No.: 15/447,310

(22) Filed: Mar. 2, 2017

(65) Prior Publication Data

US 2018/0061510 A1    Mar. 1, 2018

(30) Foreign Application Priority Data

Aug. 29, 2016   (KR) .................. 10-2016-0110209

(51) Int. Cl.
| | |
|---|---|
| G11C 29/00 | (2006.01) |
| G11C 29/50 | (2006.01) |
| G06F 11/10 | (2006.01) |
| G11C 16/10 | (2006.01) |
| G11C 16/16 | (2006.01) |
| G11C 16/26 | (2006.01) |
| G11C 29/02 | (2006.01) |
| G11C 29/42 | (2006.01) |
| G11C 29/52 | (2006.01) |
| G11C 16/34 | (2006.01) |

(52) U.S. Cl.
CPC .... *G11C 29/50004* (2013.01); *G06F 11/1044* (2013.01); *G06F 11/1048* (2013.01); *G11C 16/10* (2013.01); *G11C 16/16* (2013.01); *G11C 16/26* (2013.01); *G11C 29/021* (2013.01); *G11C 29/028* (2013.01); *G11C 29/42* (2013.01); *G11C 29/52* (2013.01); *G11C 16/349* (2013.01); *G11C 16/3454* (2013.01); *G11C 16/3459* (2013.01); *G11C 2029/5004* (2013.01)

(58) Field of Classification Search
None
See application file for complete search history.

(56) References Cited

U.S. PATENT DOCUMENTS 6,058,047 A  *  5/2000  Kikuchi .............. G06F 11/1068
                                                            365/185.33
9,224,489 B2 * 12/2015 Chae ................... G11C 11/5642
(Continued)

FOREIGN PATENT DOCUMENTS

KR           101617641        5/2016

*Primary Examiner* — Daniel F. McMahon
(74) *Attorney, Agent, or Firm* — IP & T Group LLP

(57) ABSTRACT

A data storage device includes a nonvolatile memory device; and a control unit suitable for controlling a program operation for memory cells of a page of the nonvolatile memory device, and processing a program fail in the case where the program operation fails, wherein the control unit adjusts a read voltage for discriminating an erase state and a program state having a threshold voltage most adjacent to the erase state, reads out data by applying the adjusted read voltage to the memory cells of the page, and performs an error handling operation to data stored in the memory cells of the page according to a result of comparing a reference value and a number of flipped bits of the data read out by applying the varied read voltage.

19 Claims, 12 Drawing Sheets

(56) References Cited

U.S. PATENT DOCUMENTS

| | | | | |
|---|---|---|---|---|
| 2002/0024846 A1* | 2/2002 | Kawahara | ........... | G11C 11/5621 |
| | | | | 365/185.24 |
| 2009/0113259 A1* | 4/2009 | Aritome | ................ | G11C 16/28 |
| | | | | 714/721 |
| 2011/0051514 A1* | 3/2011 | Han | ................... | G06F 11/1048 |
| | | | | 365/185.09 |
| 2011/0085379 A1* | 4/2011 | Kim | ................... | G11C 11/5628 |
| | | | | 365/185.03 |
| 2012/0265927 A1* | 10/2012 | Cho | ................... | G11C 11/5642 |
| | | | | 711/103 |
| 2013/0258778 A1* | 10/2013 | Oh | ......................... | G11C 16/26 |
| | | | | 365/185.11 |
| 2014/0063971 A1* | 3/2014 | Lee | ................... | G11C 16/0483 |
| | | | | 365/185.22 |
| 2014/0129903 A1* | 5/2014 | Yoon | ................... | G06F 11/1048 |
| | | | | 714/764 |
| 2015/0135025 A1* | 5/2015 | Kim | ................... | G06F 12/0246 |
| | | | | 714/704 |

* cited by examiner

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0110209, filed on Aug. 29, 2016, in the Korean Intellectual Property Office, which is incorporated herein by reference in its entirety.

BACKGROUND

1. Technical Field

Various embodiments generally relate to a data storage device that uses a nonvolatile memory device as a storage medium.

2. Related Art

Recently, the paradigm for the computer environment has been converted into ubiquitous computing so that computer systems can be used anytime and anywhere. Due to this, use of portable electronic devices such mobile phones, digital cameras, and notebook computers has rapidly increased. In general, a portable electronic device may use a data storage device which employs a memory device for storing data to be used in the portable electronic device.

A data storage device using a memory device provides advantages in that, since there is no mechanical driving part, stability and durability are excellent, information access speed is high and power consumption is small. Examples of data storage devices having such advantages include a universal serial bus (USB) memory device, memory cards having various interfaces, a universal flash storage (UFS) device, and a solid state drive (SSD). Continuous demand for improved portable electronic devices requires improved data storage devices.

SUMMARY

Various embodiments of the present invention are directed to a data storage device, a system including the same, and a method of operation thereof. The data storage device is capable of improving the reliability of program-failed data.

In an embodiment, a data storage device may include: a nonvolatile memory device; and a control unit suitable for controlling a program operation for memory cells of a page of the nonvolatile memory device, and processing a program fail in the case where the program operation fails, wherein the control unit adjusts a read voltage for discriminating an erase state and a program state having a threshold voltage most adjacent to the erase state, reads out data by applying the adjusted read voltage to the memory cells of the page, and performs an error handling operation to data stored in the memory cells of the page according to a result of comparing a reference value and a number of flipped bits of the data read out by applying the varied read voltage.

In an embodiment, a method for operating a data storage device including a nonvolatile memory device may include: adjusting a read voltage for discriminating an erase state and a program state having a threshold voltage most adjacent to the erase state in the case where a program operation for memory cells of a page of the nonvolatile memory device fails; reading out data by applying the adjusted read voltage to the memory cells of the page; and performing an error handling operation to data stored in the memory cells of the page according to a result of comparing a reference value and a number of flipped bits of the data read out by applying the adjusted read voltage.

According to the embodiments, the reliability of the program-failed data may be improved.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
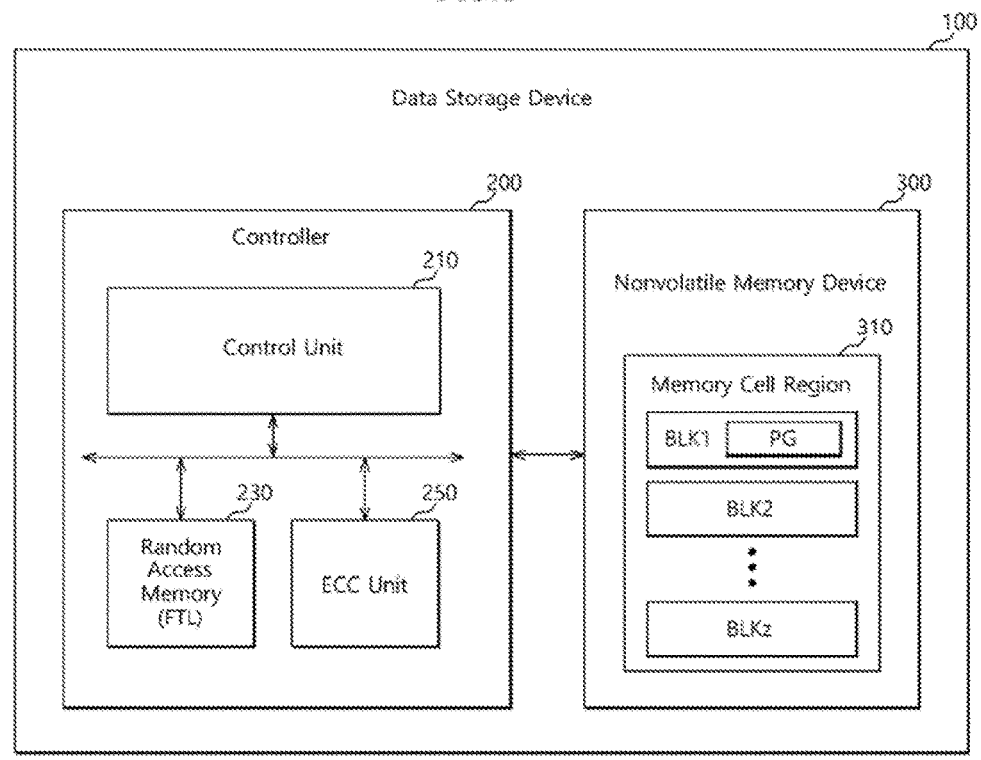
FIG. 1 is a block diagram illustrating a data storage device, in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in sufficient detail to the extent that a person skilled in the art to which the invention pertains can practice the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes," "comprises," "comprising," and/or "including," when used in this specification, specify the presence of at least one stated feature, step, operation, and/or element, but do not preclude the presence or addition of one or more other features, steps, operations, and/or elements thereof.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, a data storage device and an operating method thereof will be described below with reference to the accompanying drawings through various examples of embodiments.

Referring now to FIG. 1, a data storage device 100 is provided, in accordance with an embodiment of the present invention.

The data storage device 100 may store data to be accessed by a host device (not shown) such as a mobile phone, an MP3 player, a laptop computer, a desktop computer, a game player, a TV, an in-vehicle infotainment system and so forth. The data storage device 100 may also be referred to as a memory system.

The data storage device 100 may be configured as any one of various kinds of storage devices according to the protocol of an interface which is electrically coupled with the host device. For example the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device a universal flash storage (UFS) device, a personal computer memory card international association (PCMCIA) card storage device, a peripheral component interconnection (PCI) card storage device, a PCI express (PCI-E) card storage device, a compact flash (CF) card, a smart media card, a memory stick, and so forth.

The data storage device 100 may be manufactured as any one among various kinds of packages, such as, for example, a package-on-package (POP), a system-in-package (SIP), a system-on-chip (SOC), a mufti-chip package (MCP), a chip-on-board (COB), a wafer-level fabricated package (WFP) and a wafer-level stack package (WSP).

The data storage device 100 may include a controller 200. The controller 200 may include a control unit 210, a random access memory 230, and an error correction code (ECC) unit 250.

The control unit 210 may control an operation of the controller 200. The control unit 210 may analyze and process a signal or a request which is inputted from the host device. To this end, the control unit 210 may drive an instruction or an algorithm of a code, that is, a firmware or a software, loaded in the random access memory 230, and may control operations of function blocks in the controller 200. The control unit 210 may be constructed by a micro control unit (MCU), a central processing unit (CPU), or the like.

The random access memory 230 may store a firmware or a software to be driven by the control unit 210. Also, the random access memory 230 may store data necessary for the driving of the firmware or the software, for example, metadata. That is to say, the random access memory 230 may operate as the working memory of the control unit 210.

The random access memory 230 may temporarily store data to be transmitted from the host device to a nonvolatile memory device 300 or from the nonvolatile memory device 300 to the host device. In other words, the random access memory 230 may operate as a data buffer memory or a data cache memory.

The error correction code (ECC) unit 250 may perform an error detecting operation for detecting whether an error is included in the data read out from the nonvolatile memory device 300 and an error correcting operation for correcting the error included in the data. To this end, the error correction code (ECC) unit 250 may generate an error correction code for data to be stored in the nonvolatile memory device 300. The error correction code (ECC) unit 250 may detect and correct an error of the data read out from the nonvolatile memory device 300, based on the error correction code. In the case where errors are detected which are within an error correction capability, the error correction code (ECC) unit 250 may correct the detected errors. In the case where errors are detected which go out of the error correction capability, the error correction code (ECC) unit 250 can not correct the detected errors. In the case where detected errors are not corrected, a read fail for the nonvolatile memory device 300 may occur.

The data storage device 100 may include the nonvolatile memory device 300. The nonvolatile memory device 300 may be used as the storage medium of the data storage device 100. The nonvolatile memory device 300 may be configured by a NAND flash memory device. Otherwise, the nonvolatile memory device 300 may be configured by any one of various types of nonvolatile memory devices such as a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal oxide, according to memory cells which construct a memory cell region 310.

The memory cell region 310 may include a plurality of memory cells. From an operational viewpoint or a physical (or structural) viewpoint, the memory cells included in the memory cell region 310 may be configured into a hierarchical memory cell set or memory cell unit. For example, memory cells which are coupled to the same word line and are to be read and programmed (or written) simultaneously may be configured as a page PG. Also, memory cells to be erased simultaneously may be configured into a memory block BLK. The number of memory blocks which configure the memory cell region 310 and the number of pages which are included in each memory block may be changed variously.

Figure 2:
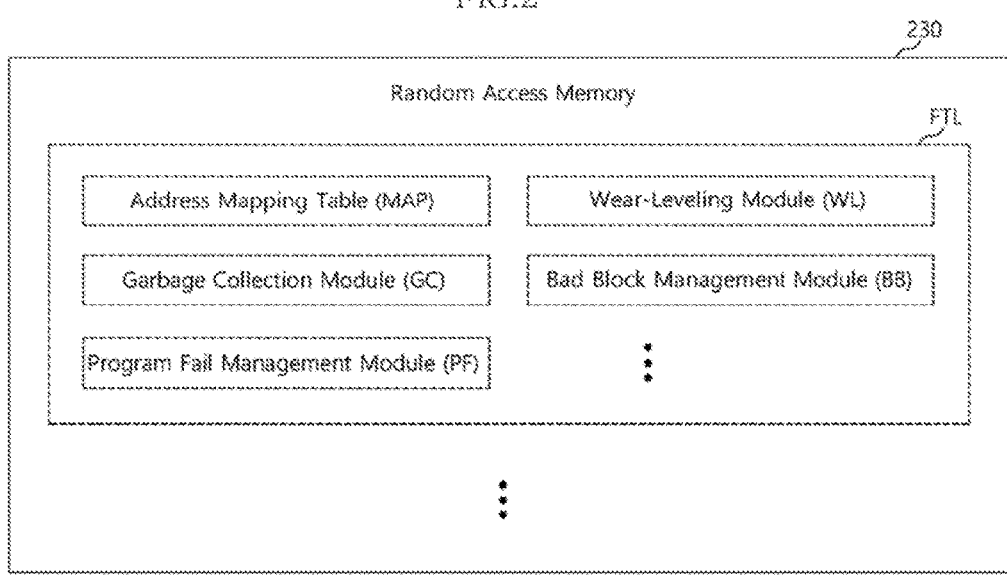
FIG. 2 is a representation of an example of a diagram to assist in the explanation of a firmware or a software to be driven in a working memory shown in the data storage device of FIG. 1.

FIG. 2 is a representation of an example of a diagram to assist in the explanation of a firmware or a software to be driven in the working memory 230 shown in FIG. 1.

As aforementioned, the control unit 210 may control an erase operation by the unit of memory block, and control a read or program operation by the unit of page. The nonvolatile memory device 300 is impossible to perform an overwrite operation, i.e., the control unit must first delete old data before it can write new data in the same memory cells. Hence, the control unit 210 performs an erase operation to delete previously stored data before new data can be stored in memory cells stored with data.

The control unit 210 may drive a firmware or a software referred to as a flash translation layer FTL, to control the intrinsic operations of the nonvolatile memory device 300 and provide device compatibility to the host device. Through driving of such a flash translation layer FTL, the data storage device 100 may be recognized as a general data storage device such as a hard disk, by the host device.

The flash translation layer FTL may be loaded on the random access memory 230 and may be configured to include various modules for performing various functions and metadata necessary for driving of the modules. For example, referring to the example of FIG. 2, the flash translation layer FTL may include an address mapping table MAP, a wear-leveling module WL, a garbage collection module GC, a bad block management module BB, and a program fail management module PF. The flash translation layer may include other modules which are well known in the art but which are not necessary for describing the present invention and are therefore not included in the description of the present disclosure.

In the case where the host device accesses the data storage device 100 (for example, requests a read operation or a write operation), the host device may provide a logical address to the data storage device 100. The flash translation layer FTL may translate the provided logical address into a physical address of the nonvolatile memory device 300, and perform the requested operation by referring to the converted physical address. In order to perform such address translation operation, address translation data, that is, the address mapping table MAP may be included in the flash translation layer FTL.

The wear-leveling module WL evens out the wear of the various pages or memory blocks of the nonvolatile memory device 300. Memory cells of the nonvolatile memory device 300 may wear out ("age") by program and erase operations. Aged memory cells, that is, worn-out memory cells may cause fails. The wear-leveling module WL may level out the program-erase counts of respective memory blocks to prevent a certain memory block from being worn out earlier than other memory blocks.

The garbage collection module GC may manage memory blocks where fragmented data are stored. As described above, the nonvolatile memory device 300 is impossible to perform an overwrite operation, and unit of erase may be larger than unit of program. For this reason, the nonvolatile memory device 300 may employ an operation of collecting valid data dispersed at physically different positions to one place, when a storage space reaches a limit. The garbage collection module GC may perform an operation of collecting valid data fragmented due to performance of a plurality of write operations and a plurality of erase operations, to a collection area.

The bad block management module BB may manage a memory block in which a fail has occurred, among the memory blocks of the nonvolatile memory device 300. As described above, a fail may occur in a worn-out memory cell. Data stored in a failed memory cell may not be read out normally. Moreover, data may not be stored normally in a failed memory cell. The bad block management module BB may manage a memory block which includes a failed memory cell, so that the failed memory cell is no longer used. The program fail management module PF may process a program fail in the case where the program operation of the nonvolatile memory device 300 fails. For example, the program fail management module PF may read out the data of a page in which a program fail has occurred, by changing a read voltage, and perform an error handling operation for the data of the page in which a program fail has occurred, according to a result of comparing read-out data and criteria. The operation of the program fail management module PF will be described later in detail.

Figure 3:
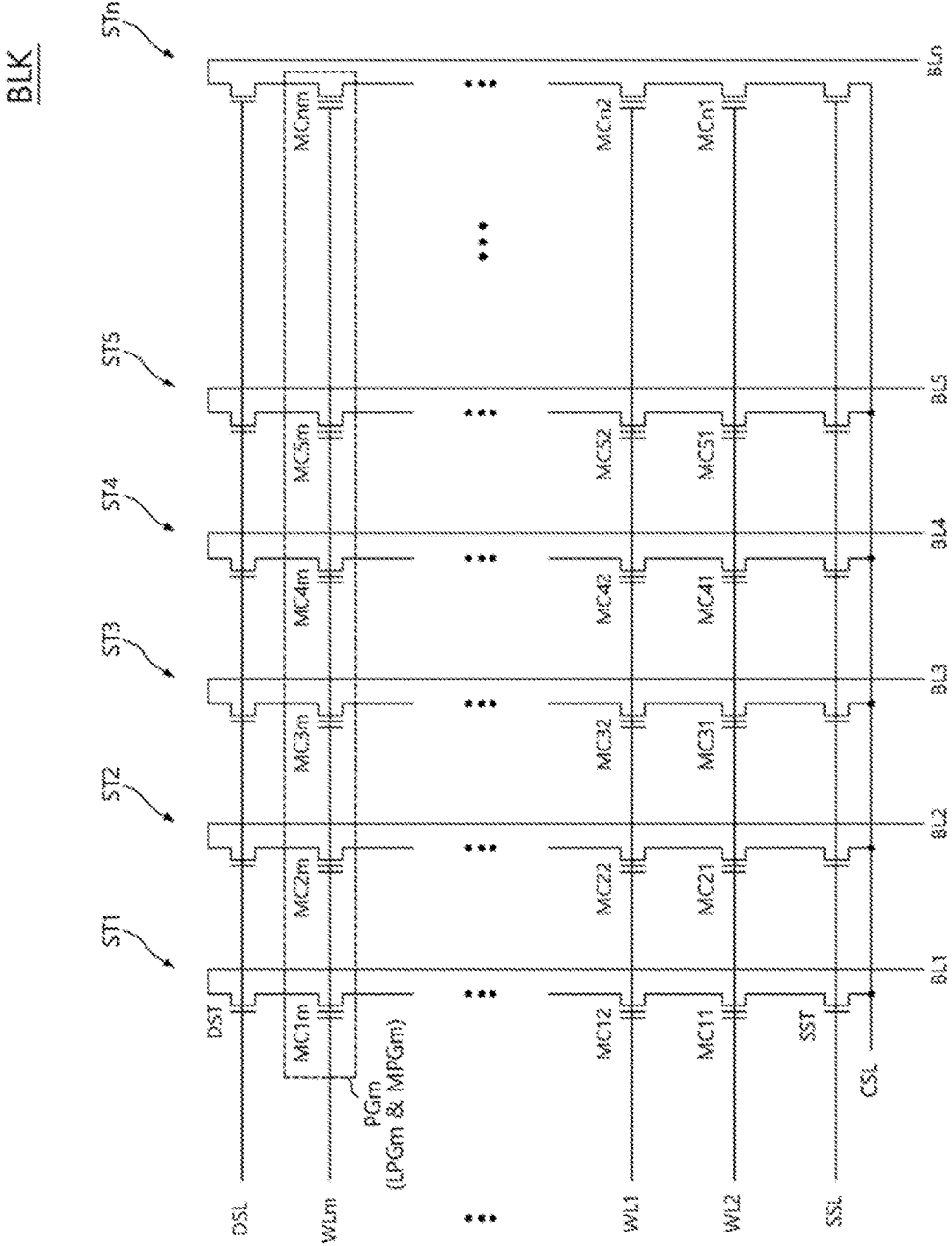
FIG. 3 is a circuit diagram illustrating a memory block of a nonvolatile memory device employed in the data storage device of FIG. 1 in accordance with an embodiment of the present invention.

FIG. 3 is a circuit diagram illustrating a memory block of the nonvolatile memory device 300. A memory block BLK may include a plurality of cell strings ST1 to STn which are coupled to a plurality of bit lines BL1 to BLn, wherein each cell string is coupled to a single bit line. The cell strings ST1 to STn have the same circuit configuration, and for the sake of convenience in explanation, one cell string ST1 will be described below representatively.

The cell string ST1 may include a drain select transistor DST, plurality of memory cells MC11 to MC1m and a source select transistor SST which are coupled in series in the recited order between the bit line BL1 and a common source line CSL. In detail, the drain select transistor DST of the cell string ST1 is coupled to a drain select line DSL, and the source select transistor SST of the cell string ST1 coupled to the source select line SSL. The gates of the plurality of memory cells MC11 to MC1m are respectively coupled to a plurality of word lines WL1 to WLm.

Figure 4:
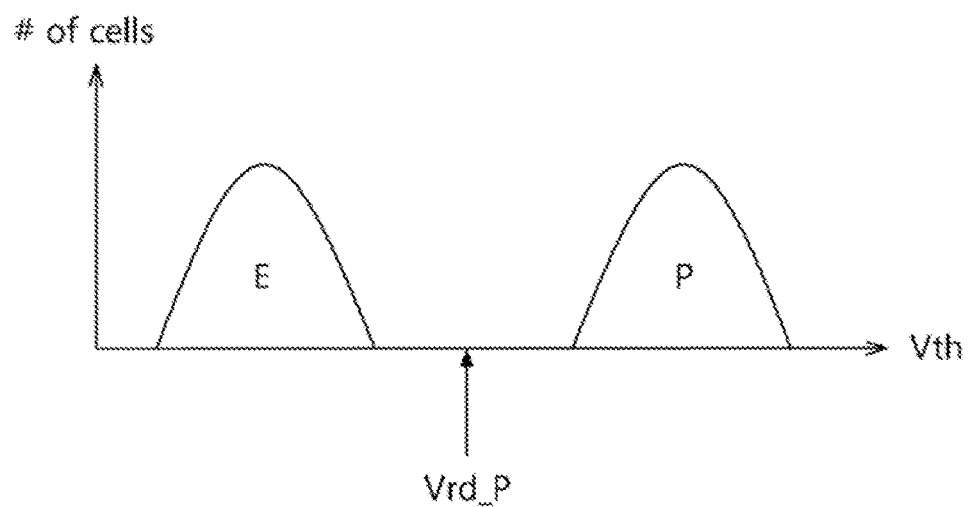
FIGS. 4 and 5 are diagrams illustrating examples of threshold voltage distributions of memory cells of a nonvolatile memory device, according to an embodiment of the present invention.
Figure 5:
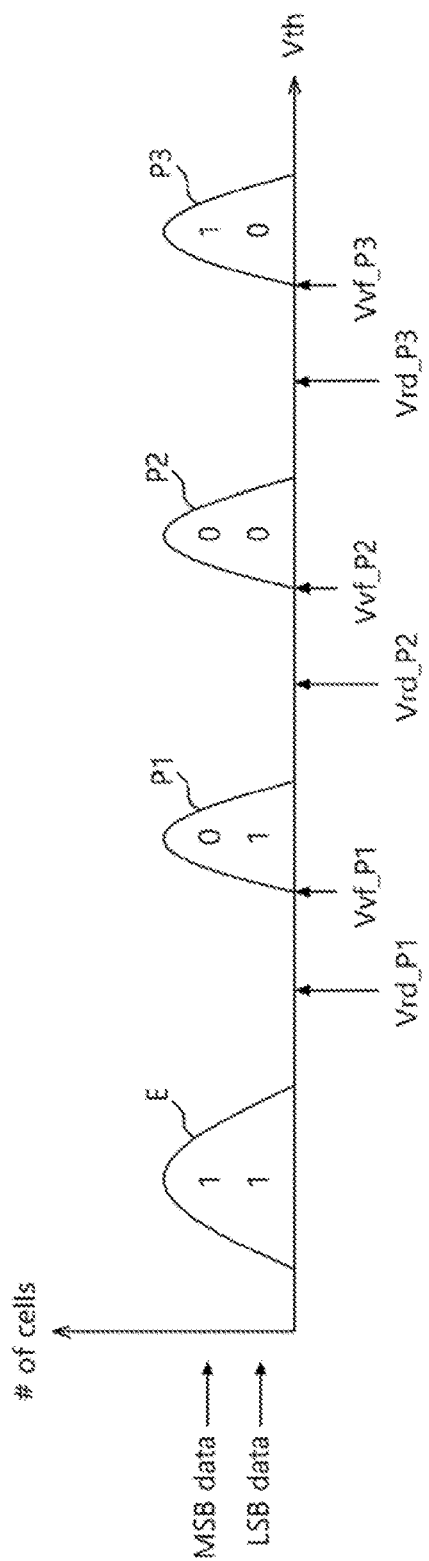

Memory cells MC1m to MCnm which are coupled to the same word line WLm may be read and programmed (or written) simultaneously. In the case where the memory cells MC1m to MCnm are single level cells as shown in FIG. 4, the memory cells MC1m to MCnm may be configured as one page PGm. In the case where the memory cells MC1m to MCnm are 2-bit multilevel cells as shown in FIG. 5, the memory cells MC1m to MCnm may be configured as two pages LPGm and MPGm. In the following descriptions, for the sake of convenience in explanation, memory cells coupled to the same word line are referred to as a "page." Also, the gate of each source select transistor is coupled to a common source select line SSL, and the gate of each drain select transistor DST is coupled to common drain select line DSL.

FIGS. 4 and 5 are diagrams illustrating examples of threshold voltage distributions of memory cells of the nonvolatile memory device, in accordance with an embodiment of the present invention.

As shown in FIG. 4, single level cells each capable of storing a single data bit may be erased to have a threshold voltage of an erase state E, and may be programmed to have a threshold voltage of a program state P. In a read operation, a read voltage Vrd_P having a voltage level between the erase state E and the program state P may be applied to the memory cells. If the read voltage Vrd_P is applied, data cells having threshold voltages of the erase state E may be discriminated as "on-cells" which store data "1," and data cells having threshold voltages of the program state P may be discriminated as "off-cells" which store data "0."

As shown in FIG, 5 multilevel cells each capable of storing two data bits may be erased to have a threshold voltage of an erase state E, and may be programmed to have a threshold voltage of any one among a plurality of program states P1, P2 and P3. In a read operation any, of a first read voltage Vrd_P1 having a voltage level between the erase state E and a first program state P1, a second read voltage Vrd_P2 having a voltage level between the first program state P1 and a second program state P2 and a third read voltage Vrd_P3 having a voltage level between the second program state P2 and a third program state P3 may be applied to memory cells.

If the second read voltage Vrd_P2 is applied, memory cells having threshold voltages of the erase state E and the first program state P1 may be discriminated as "on-cells" which store LSB data "1," and memory cells having threshold voltages of the second program state P2 and the third program state P3 may be discriminated as "off-cells" which store LSB data "0."

If the first read voltage Vrd_P1 is applied, memory cells having threshold voltages of the erase state E may be discriminated as "on-cells" which store MSB data "1," and memory cells having threshold voltages of the first program state P1 may be discriminated as "off-cells" which store MSB data "0."

If the third read voltage Vrd_P3 is applied, memory cells having threshold voltages of the second program state P2 may be discriminated as "on-cells" which store MSB data "0," and memory cells having threshold voltages of the third program state P3 may be discriminated as "off-cells" which store MSB data "1."

In a program operation, in order to determine whether a program is completed, program verify voltages Vvf_P1, Vvf_P2 and Vvf_P3 may be applied to memory cells.

If a first program verify voltage Vvf_P1 is applied to memory cells which should be programmed to the first program state P1, a memory cell which has a threshold voltage lower than the first program verify voltage Vvf_P1 may be discriminated as an "on-cell", that is, a memory cell which is not program-completed, and a memory cell which has a threshold voltage higher than the first program verify voltage Vvf_P1 may be discriminated as an "off-cell", that is, a memory cell which is program-completed.

If a second program verify voltage Vvf_P2 is applied to memory cells which should be programmed to the second program state P2, a memory cell which has a threshold voltage lower than the second program verify voltage Vvf_P2 may be discriminated as an "on-cell", that is, a memory cell which is not program-completed, and a memory cell which has a threshold voltage higher than the second program verify voltage Vvf_P2 may be discriminated as an "off-cell" that is, a memory cell which is program-completed.

If a third program verify voltage Vvf_P3 is applied to memory cells which should be programmed to the third program state P3, a memory cell which has a threshold voltage lower than the third program verify voltage Vvf_P3 may be discriminated as an "on-cell", that is, a memory cell which is not program-completed, and a memory cell which has a threshold voltage higher than the third program verify voltage Vvf_P3 may be discriminated as an "off-cell", that is, a memory cell which is program-completed.

Figure 6:
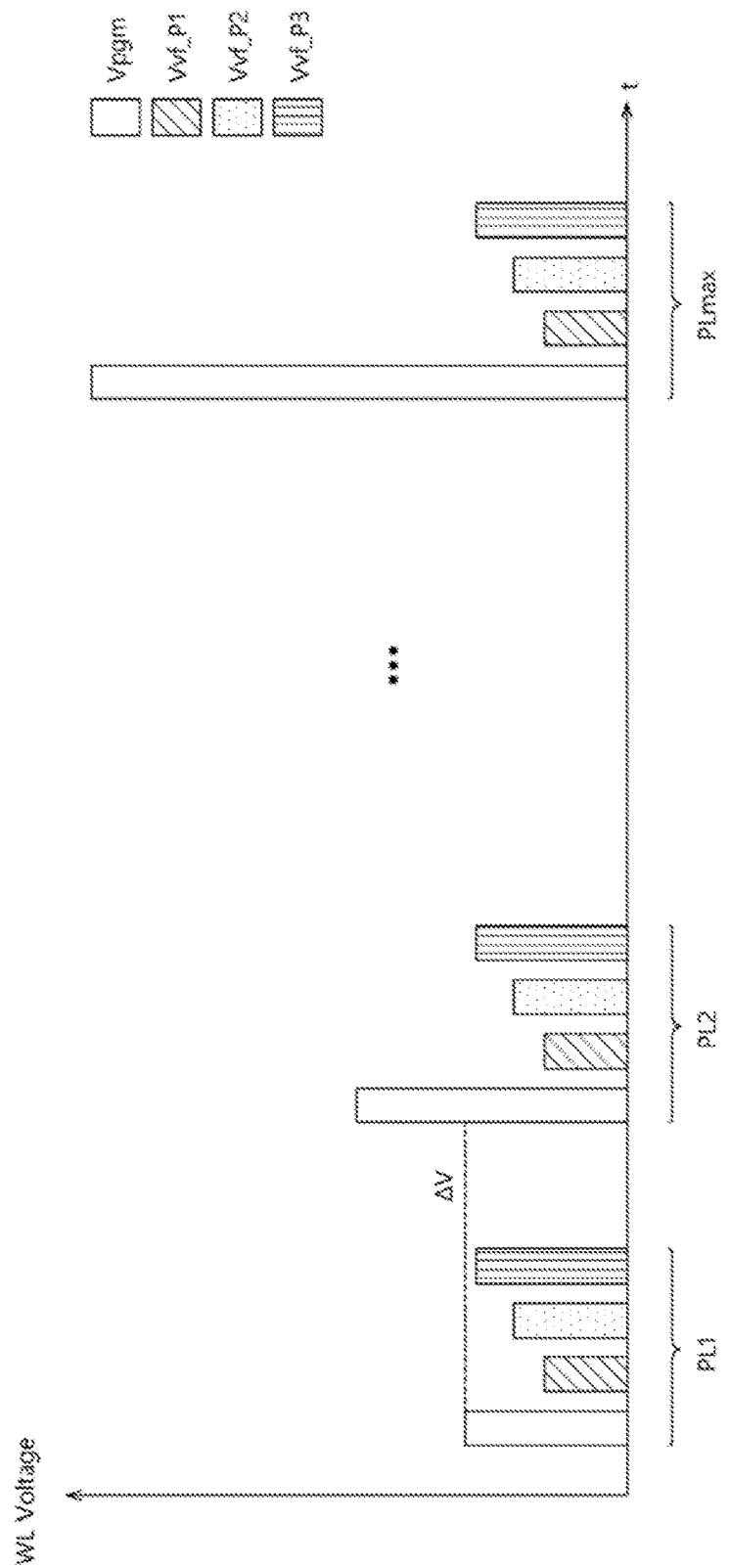
FIG. 6 is a representation of an example of a diagram to assist in the explanation of a program fail of a nonvolatile memory device.

FIG. 6 is a diagram to assist in the explanation of a program fail of a nonvolatile memory device. For the sake of convenience in explanation, a program fail of the nonvolatile memory device will be described below by exemplifying the 2-bit multilevel cells shown in FIG. 5.

In order to make threshold voltage distributions dense and secure a margin between the threshold voltage distributions, memory cells may be programmed by using an incremental step pulse program scheme.

According to the incremental step pulse program scheme, one pulse of a program voltage Vpgm may be applied to memory cells, and then, the program verify voltages Vvf_P1, Vvf_P2 and Vvf_P3 may be applied to check whether programming of the memory cells is completed. Namely, the program verify voltages Vvf_P1, Vvf_P2 and Vvf_P3 may be applied each time one pulse of the program voltage Vpgm is applied to memory cells. A set of the operation of applying a single pulse of the program voltage Vpgm and the operation of applying the program verify voltages Vvf_P1, Vvf_P2 and Vvf_P3 may be configured as a single program loop PL.

After a program verify operation is performed, if a memory cell is determined as not program-completed yet, a program voltage Vpgm increased by an increment $\Delta V$ (or a step voltage or a step pulse) and then the program verify voltages Vvf_P1, Vvf_P2 and Vvf_P3 may be applied again to the memory cell. Namely, the program loop PL may be repeated until the memory cell is programmed to a desired threshold voltage and thus the program of the memory cell is completed. If the memory cell is not programmed to a desired threshold voltage even though a maximum program loop PLmax is performed, the program operation is ended as a "program fail."

Figure 7:
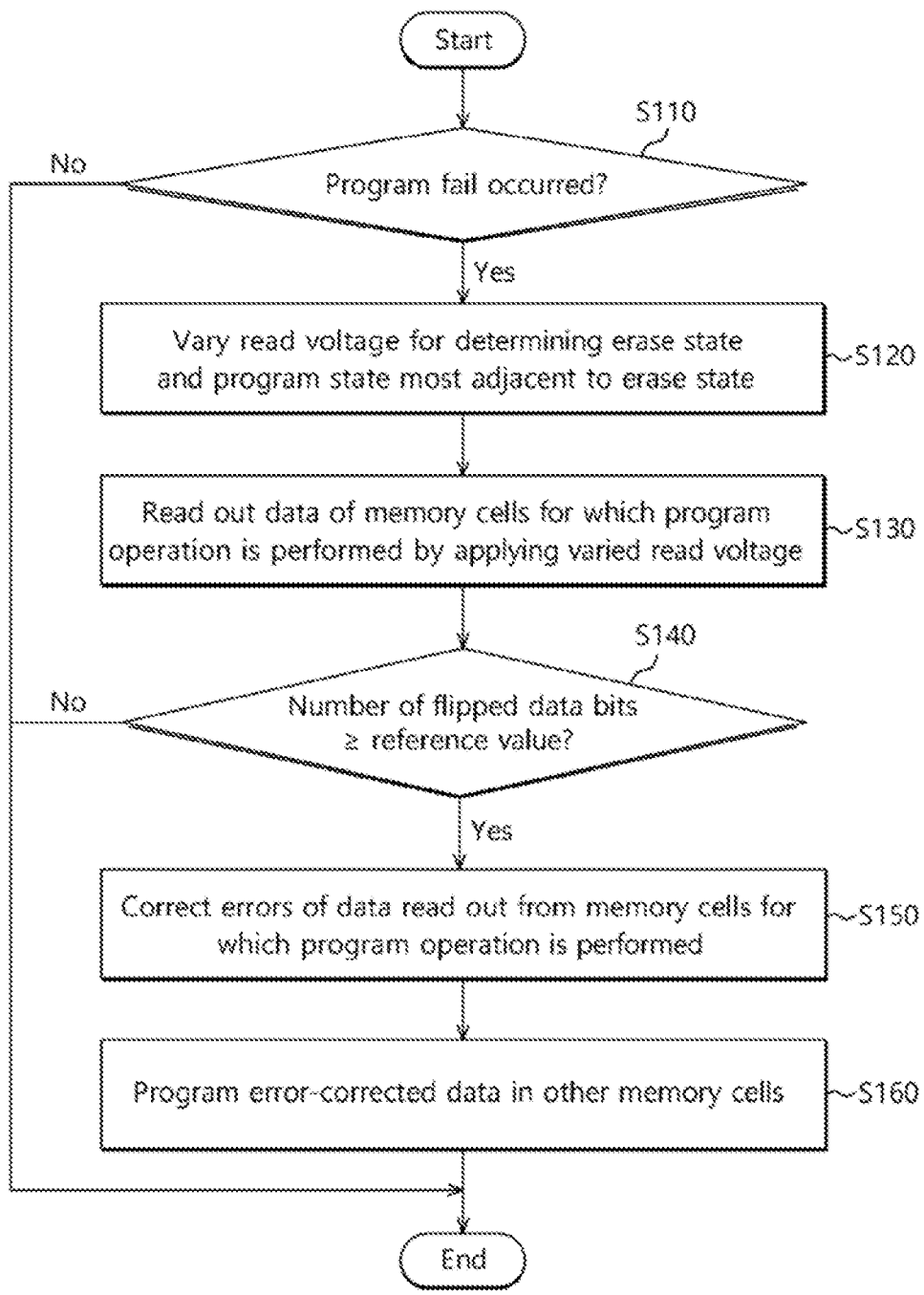
FIG. 7 is a flow chart of a program fail management operation of a nonvolatile memory device, in accordance with an embodiment of the present invention.
Figure 8:
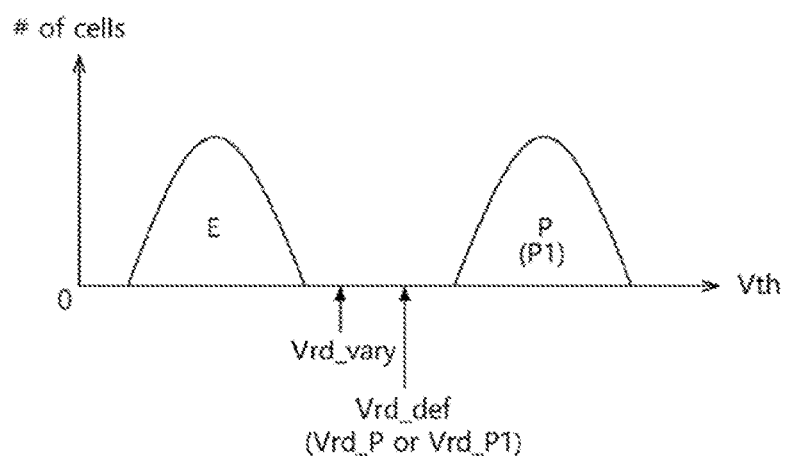
FIG. 8 is a diagram illustrating an example of a read voltage varying step of the program fail management operation of FIG. 7.
Figure 9:
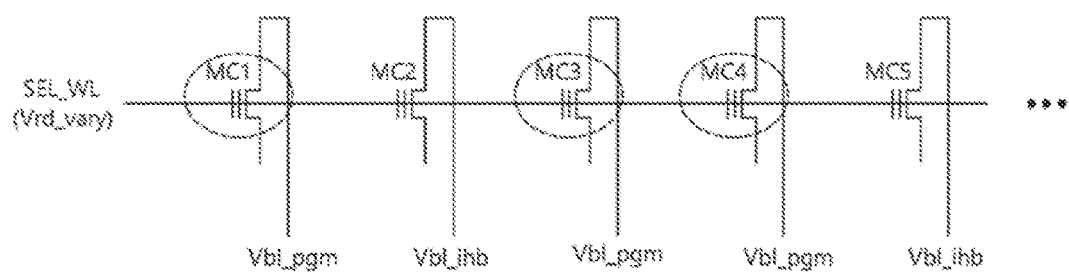
FIG. 9 is a diagram illustrating an example of a reading-out step using a varied read voltage of the program fail management operation of FIG. 7.

FIG. 7 is a flow chart to assist in the explanation of a program fail management operation of the nonvolatile memory device 300, in accordance with the embodiment of the present invention. FIG. 8 is a representation of an example of a diagram to assist in the explanation of step S120 of FIG. 7. FIG. 9 is a representation of an example of a diagram to assist in the explanation of step S130 of FIG. 7. The operation of the program fail management module PF to program-failed page will be described exemplarily with reference to FIGS. 7 to 9.

At step S110, the program fail management module PF may determine whether a program fall has occurred after the program operation as described with reference to FIG. 6 is performed. In the case where a program fail has not occurred ("NO" in step S110), the process may be ended. In the case where a program fail has occurred ("Yes" in step S110), the process may proceed to step S120.

At the step S120, the program fail management module PF may vary a read voltage for determining an erase state and a program state most adjacent to the erase state. Referring to FIG. 8, the program fail management module PF may vary a read voltage Vrd_P (a first read voltage Vrd_P1 in the case of a multilevel cell) for discriminating an erase state E and a program state P (a first program state P1 in the case of a multilevel cell) most adjacent to the erase state E. Let's define the default voltage of the read voltage Vrd_P (or Vrd_P1) as a default read voltage Vrd_def. In some embodiments, the program fail management module PF may vary the read voltage Vrd_P (or Vrd_P1) so that an adjusted read voltage Vrd_vary has lower level than the default read voltage Vrd_def.

At step S130, the program fail management module PF may control the nonvolatile memory device 300 to perform a read operation to the program-failed page by applying the adjusted read voltage Vrd_vary. Referring to FIG. 9, among memory cells MC1 to MC5 coupled to a selected word line SEL_WL of the program-failed page, the memory cells MC1, MC3 and MC4 coupled to bit lines to which a bit line voltage Vbl_pgm for program is applied are memory cells for which a program operation is performed while the memory cells MC2 and MC5 coupled to bit lines to which an inhibition voltage Vbl_ihb is applied are memory cells for which a program operation is not performed. The data of the programmed memory cells MC1, MC3 and MC4 other than the program-inhibited memory cells MC2 and MC5 may be read out as the adjusted read voltage Vrd_vary is applied to the selected word line SEL_WL.

At step S140, the program fail management module PF may determine whether the number of flipped data bits is equal to or larger than a reference value. The flipped data bits are different data bits between an original data output from the ECC unit 250 before the program operation and the data read out from the program failed page by the adjusted read voltage Vrd_vary. The program fail management module PF may determine the number of flipped data bits by comparing the original data and the data read out by the adjusted read voltage Vrd_vary. The reference value may be set within the error correction capability of the error correction code (ECC) unit 250. In an embodiment, the reference value may be set within 50% of the number of error-correctable bits.

In the case where the number of flipped data bits is smaller than the reference value, the process may be ended. In the case where the number of flipped data bits is equal to or larger than the reference value, an error handling operation for the data of the program-failed page may be performed as in step S150 and step S160.

At the step S150, the program fail management module PF may control the error correction code (ECC) unit 250 to correct the error of the data read out from the memory cells of the program-failed page, The data of the program-failed page may have been ECC encoded to become the original data before the program operation. Therefore, the data of the program-failed page, which may be read out using the default read voltage Vrd_def, may be ECC-corrected by the error correction code (ECC) unit 250.

At step S160, the error-corrected data may be programmed in other memory cells. For instance, the error-corrected data may be programmed in a page other than the program-failed page. The page other than the program-failed page may be a page in the same memory block or in a different memory block.

Figure 10:
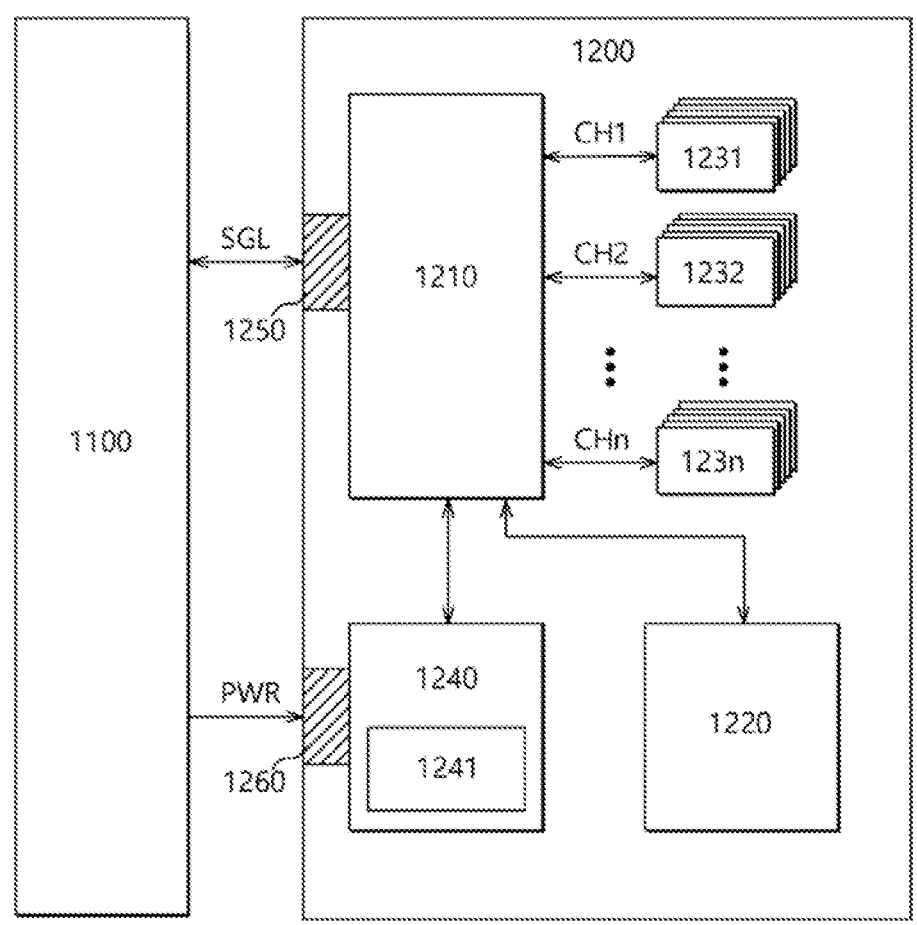
FIG. 10 is a block diagram illustrating a data processing system including a solid state drive (SSD) in accordance with an embodiment of the present invention.

FIG. 10 is a block diagram illustrating a data processing system 1000 including a host device 1100 and solid state drive (SSD) 1200, in accordance with an embodiment of the present invention.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control an operation of the SSD 1200.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacitance capacitors capable of charging power PWR.

The controller 1210 may exchange a signal SGL with the host device 1100 through the signal connector 1250. The signal SGL may include a command, an address, data, and so forth. The signal connector 1250 may be constructed by various types of connectors depending on an interface scheme between the host device 1100 and the SSD 1200.

Figure 11:
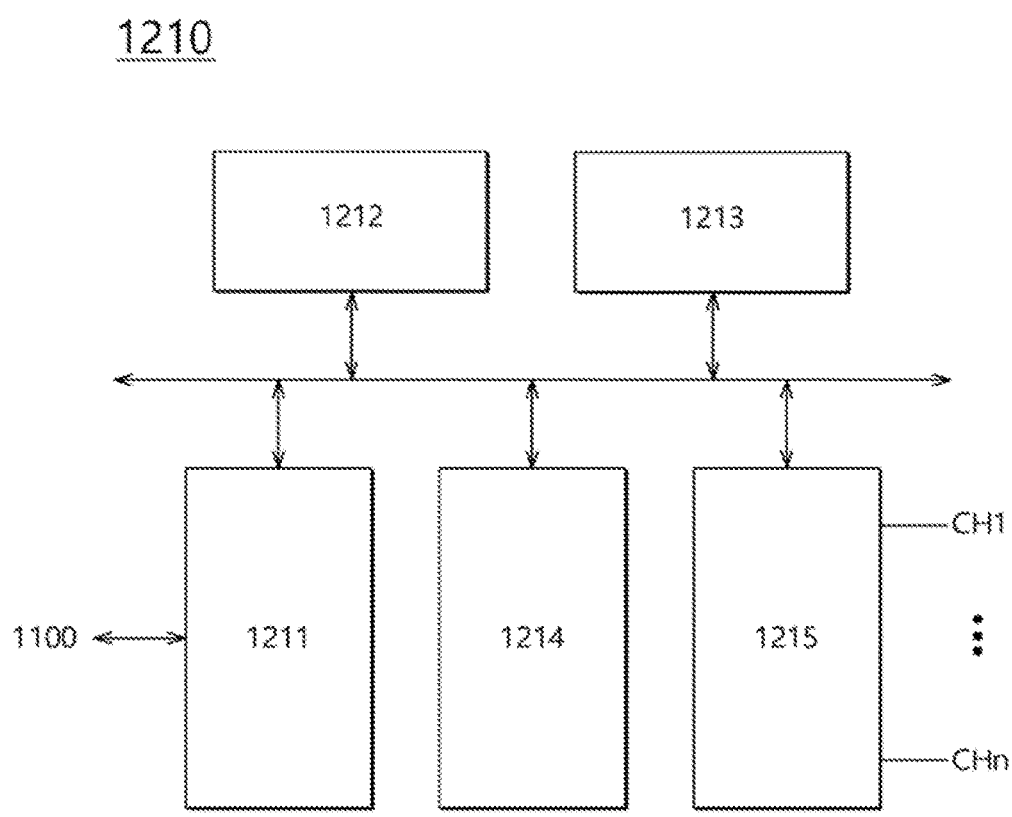
FIG. 11 is a diagram illustrating an example of a controller shown in the data processing system of FIG. 10.

FIG. 11 is a diagram illustrating a representation of an example of the controller shown in FIG. 10. Referring to FIG. 11, the controller 1210 may include a host interface unit 1211, a control unit 1212, a random access memory 1213, an error correction code (ECC) unit 1214, and a memory interface unit 1215.

The host interface unit 1211 may provide interfacing with respect to the SSD 1200 in correspondence to the protocol of the host device 1100. For example, the host interface unit 1211 may communicate with the host device 1100 through at least one of a secure digital, a universal serial bus (USB), a multimedia card (MMC). embedded MMC (eMMC), a personal computer memory card international association (PCMCIA) a parallel advanced technology attachment (PATA), a serial advanced technology attachment (SATA), small computer system interface (SCSI), a serial attached SCSI (SAS), peripheral component interconnection (PCI), a PCI express (PCI-E) and a universal flash storage (UFS) protocols. In addition, the host interface unit 1211 may perform a disk emulating function for supporting the host device 1100 to recognize the SSD 1200 as a general purpose data storage device, for example, a hard disk drive (HDD).

The control unit 1212 may analyze and process the signal SGL inputted from the host device 1100. The control unit 1212 may control operations of internal function blocks according to a firmware or a software for driving the SSD 1200. The random access memory 1213 may be used as a working memory for driving such a firmware or software. Any suitable control unit may be used.

The error correction code (ECC) unit 1214 may generate the parity data of data to be transmitted to the nonvolatile memory devices 1231 to 123n. The generated parity data may be stored together with the data in the nonvolatile memory devices 1231 to 123*n*. The error correction code (ECC) unit 1214 may detect an error of the data read out from the nonvolatile memory devices 1231 to 123*n*, based on parity data. If a detected error is within a correctable range, the error correction code (ECC) unit 1214 may correct the detected error. Any suitable error correction code (ECC) unit may be used.

The memory interface unit 1215 may provide an interface between the controller 1210 and the nonvolatile memory devices 1231 to 123*n*. The memory interface unit 1215 may provide control signals such as commands and addresses to the nonvolatile memory devices 1231 to 123*n*, according to control of the control unit 1212. Moreover, the memory interface unit 1215 may exchange data with the nonvolatile memory devices 1231 to 123*n*, according to control of the control unit 1212. For example, the memory interface unit 1215 may provide the data stored in the buffer memory device 1220, to the nonvolatile memory devices 1231 to 123*n*, or provide the data read out from the nonvolatile memory devices 1231 to 123*n*, to the buffer memory device 1220. Any suitable memory interface may be used.

Figure 12:
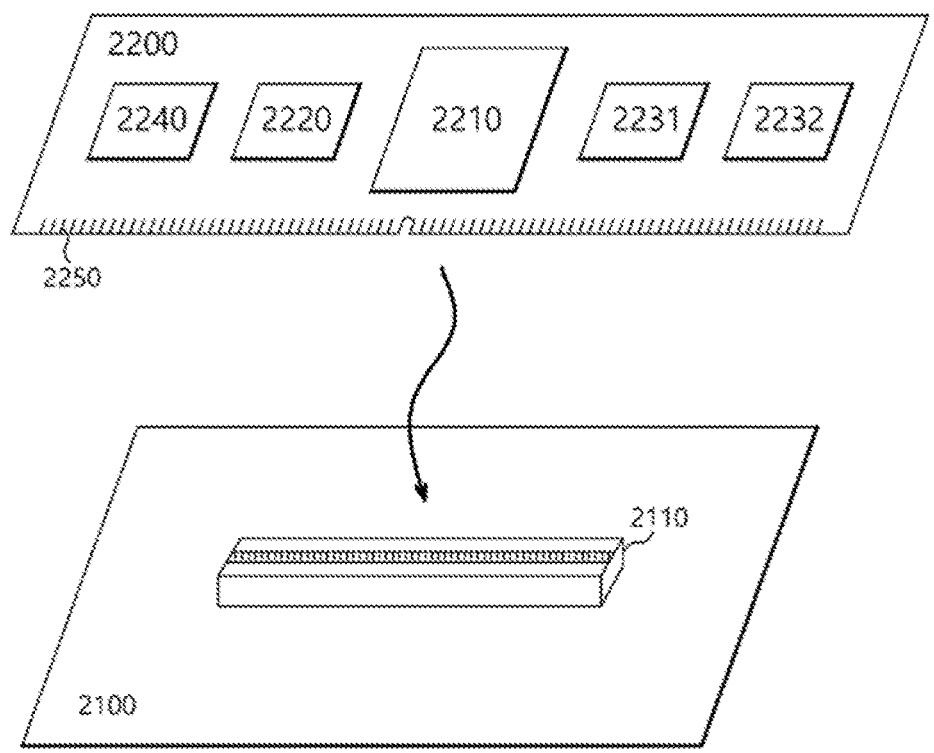
FIG. 12 is a diagram illustrating a data processing system including a data storage device, in accordance with an embodiment of the present invention.

FIG. 12 is a diagram illustrating a data processing system including a data storage device in accordance with an embodiment of the present invention. Referring to FIG. 12, a data processing system 2000 may include a host device 2100 and a data storage device 2200.

The host device 2100 may be constructed in the form of a board such as a printed circuit board. Although not shown, the host device 2100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be constructed in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control an operation of the data storage device 2200. The operation may be at least one of a read, write, erase, wear-leveling, bad block management operation, program fail management operation, and garbage collection operation. The controller 2210 may be configured in the same manner as the controller 1210 shown in FIG. 11.

The buffer memory device 2220 may temporarily store data to be stored in the nonvolatile memory devices 2231 and 2232. Further, the buffer memory device 2220 may temporarily store the data read out from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be constructed into various types depending on an interface scheme between the host device 2100 and the data storage device 2200. The connection terminal 2250 may be disposed on any one side of the data storage device 2200.

Figure 13:
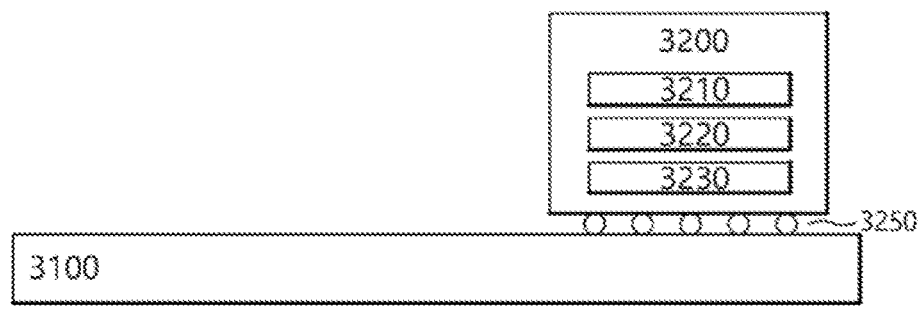
FIG. 13 is a block diagram illustrating a data processing system including a data storage device, in accordance with an embodiment of the present invention.

FIG. 13 is a block diagram illustrating a data processing system 3000 including a data storage device 3200 and a host device, in accordance with an embodiment of the present invention. The host device 3100 may be constructed in the form of a board such as a printed circuit board. Although not shown, the host device 3100 may include internal function blocks for performing the functions of a host device.

The data storage device 3200 may be constructed in the form of a surface-mounting type package. The data storage device 3200 may be mounted to the host device 3100 through a plurality of solder balls 3250. The data storage device 3200 may include a controller 3210, a buffer memory device 3220, and a nonvolatile memory device 3230.

The controller 3210 may control an operation of the data storage device 3200. The operation may be at least one of a read, write, erase, wear-leveling, bad block management operation, program fail management operation and garbage collection operation. The controller 3210 may be configured in the same manner as the controller 1210 shown in FIG. 11.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 14:
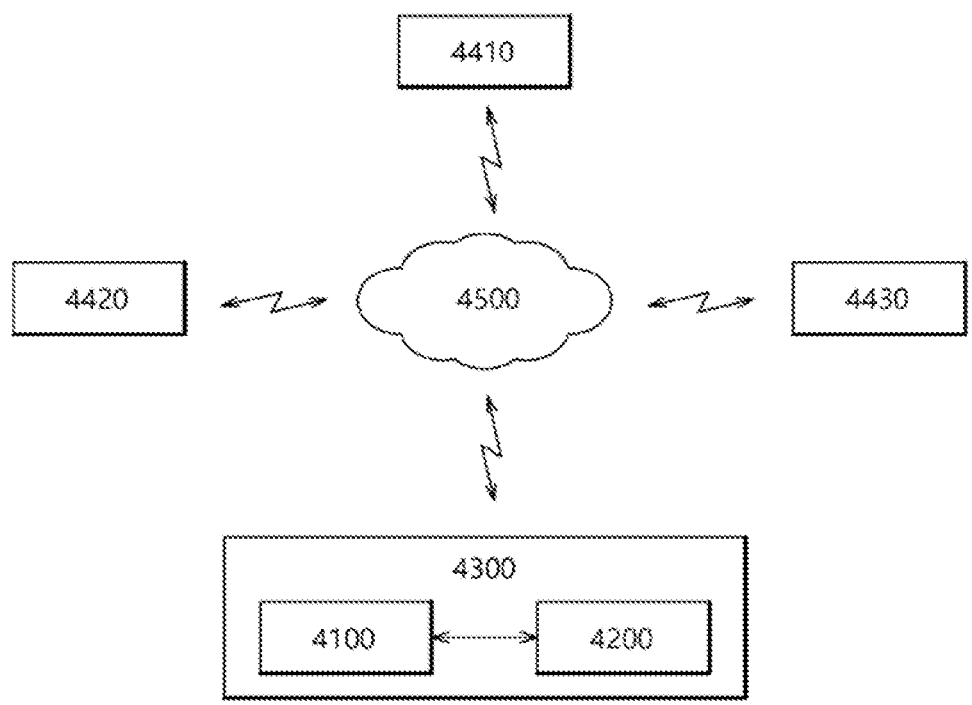
FIG. 14 is a diagram illustrating a network system including a data storage device, in accordance with an embodiment of the present invention.

FIG. 14 is a diagram illustrating a, a network system 4000 which includes a server system 4300 and client systems 4410 to 4430 which are coupled through a network 4500, in accordance with an embodiment of the present invention.

The server system 4300 may service data in response to a request from any of the plurality of client systems 4410 to 4430. For example, the server system 4300 may store the data provided from any of the plurality of client systems 4410 to 4430. For another example, the server system 4300 may provide data to any of the plurality of client systems 4410 to 4430.

The server system 4300 may include a host device 4100 and a data storage device 4200. The data storage device 4200 may be identical or similar to the data storage device 100 shown in FIG. 1, the data storage device 1200 shown in FIG. 10, the data storage device 2200 shown in FIG. 12 or the data storage device 3200 shown in FIG. 13.

Figure 15:
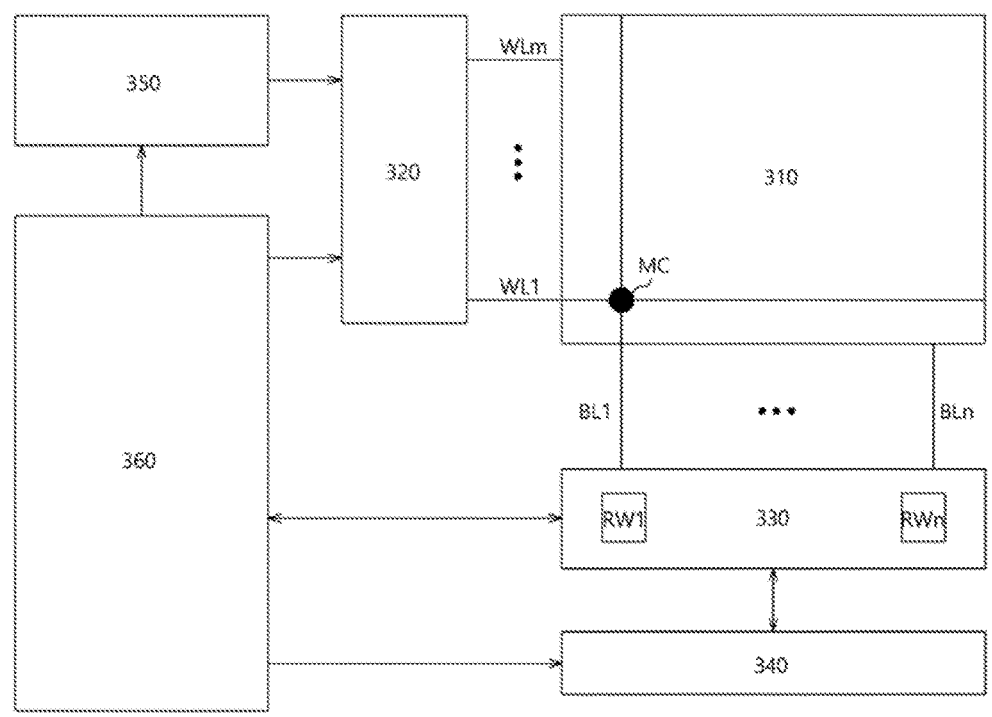
FIG. 15 is a block diagram illustrating a nonvolatile memory device included in a data storage device, in accordance with an embodiment of the present invention.

FIG. 15 is a block diagram illustrating a nonvolatile memory device 300 included in a data storage device 100 of FIG. 1, in accordance with an embodiment of the present invention. Referring to FIG. 15, the nonvolatile memory device 300 may include a memory cell array 310, a row decoder 320, a column decoder 330, a data read/write block 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLn. The data read/write block 340 may operate according to control of the control logic 360. The data read/write block 340 may operate as a write driver or a sense amplifier according to an operation mode. For example, the data read/write block 340 may operate as a write driver which stores data provided from the external device, in the memory cell array 310 in a write operation. For another example, the data read/write block 340 may operate as a sense amplifier which reads out data from the memory cell array 310 in a read operation.

The column decoder 330 may operate according to control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines (or data input/output buffers), based on a decoding result.

The voltage generator 350 may generate voltages to be used in internal operations of the semiconductor memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control an operation of the semiconductor memory device 300, based on control signals provided from the external device. For example, the control logic 360 may control operations of the semiconductor memory device 300 such as a read, write, erase, wear-leveling, bad block management operation, program fail management operation, and garbage collection operation of the semiconductor memory device 300.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a nonvolatile memory device; and
   a control unit suitable for controlling a program operation for memory cells of a page of the nonvolatile memory device, and processing a program fail in a case where the program operation fails,
   wherein the control unit adjusts a read voltage for discriminating an erase state and a program state having a threshold voltage most adjacent to the erase state among program states having threshold voltage, reads out data by applying the adjusted read voltage to the memory cells of the page, and performs an error handling operation to the data stored in the memory cells of the page according to a result of comparing a reference value and a number of flipped bits, which are different data bits between an original data output from the ECC unit before the program operation and the data read out by applying the adjusted read voltage.

2. The data storage device according to claim 1, wherein the control unit performs the error handling operation in a case where the number of flipped bits is equal to or larger than the reference value.

3. The data storage device according to claim 2, wherein the control unit determines the number of flipped bits by comparing the data read out by applying the adjusted read voltage and original data of a program-failed page.

4. The data storage device according to claim 1, further comprising an error correction code unit suitable for correcting an error of data read out from the nonvolatile memory device.

5. The data storage device according to claim 4, wherein the control unit performs the error handling operation by correcting an error of the data read out from the memory cells of the page, through the error correction code unit, and programming an error-corrected data in a different page other than the page.

6. The data storage device according to claim 4, wherein the control unit variably sets the reference value within error correction capability of the error correction code unit.

7. The data storage device according to claim 1, wherein the control unit adjusts the read voltage to a voltage lower than a default read voltage for discriminating the erase state and the program state most adjacent to the erase state among program states having threshold voltages.

8. The data storage device according to claim 1, wherein the control unit reads out the data stored in memory cells excluding memory cells program-inhibited among the memory cells of the page.

9. A method for operating a data storage device including a nonvolatile memory device, the method comprising:
   adjusting a read voltage for discriminating an erase state and a program state having a threshold voltage most adjacent to the erase state among program states having threshold voltages in a case where a program operation for memory cells of a page of the nonvolatile memory device fails;
   reading out data by applying the adjusted read voltage to the memory cells of the page; and
   performing an error handling operation to the data stored in the memory cells of the page according to a result of comparing a reference value and a number of flipped bits, which are different data bits between an original data output from an ECC unit before the program operation and the data read out by applying the adjusted read voltage.

10. The method according to claim 9, wherein the error handling operation is performed in a case where the number of flipped bits is equal to or larger than the reference value.

11. The method according to claim 10, wherein the performing of the error handling operation includes determining the number of flipped bits by comparing the data read out by applying the adjusted read voltage and original data of a program-failed page.

12. The method according to claim 9, wherein the performing of the error handling operation includes:
   correcting an error of the data read out from the memory cells of the page, through an error correction code unit, and
   programming an error-corrected data in a different page other than the page.

13. The method according to claim 12, wherein the reference value is variably set within error correction capability of the error correction code unit.

14. The method according to claim 9, wherein the read voltage is adjusted to a voltage level lower than a default read voltage for discriminating the erase state and the program state most adjacent to the erase state among program states having threshold voltages.

15. The method according to claim 9, wherein the reading out of the data is performed except for memory cells program-inhibited among the memory cells of the page.

16. A data storage device comprising:
a nonvolatile memory device;
an ECC unit suitable for error-correcting data stored in the nonvolatile memory device; and
a control unit suitable for:
adjusting a read voltage for a program-failed page of the nonvolatile memory device from a default read voltage to an adjusted read voltage for reading a memory cell of an erase state and a program state most adjacent to the erase state among program states having threshold voltages, counting a number of different bits between data read out from the program-failed page using the adjusted read voltage and original data of the program-failed page, and controlling the ECC unit to error-correct the data read out from the program-failed page using the default read voltage when the number of different bits is equal to or greater than a reference value.

17. The data storage device of claim 16, wherein the control unit further controls the nonvolatile memory device to store the error-corrected data in a page other than the program-failed page.

18. The data storage device of claim 16, wherein the control unit adjusts the read voltage so that the adjusted read voltage has lower level than the default read voltage.

19. The data storage device of claim 16, wherein the reference value is set by a number of error-correctable bits of the data read out from the program-failed page which is error correction capability of the ECC unit.

* * * * *